(12) United States Patent
Castro

(10) Patent No.: US 8,530,360 B2
(45) Date of Patent: Sep. 10, 2013

(54) METHOD FOR LOW STRESS FLIP-CHIP ASSEMBLY OF FINE-PITCH SEMICONDUCTOR DEVICES

(75) Inventor: Abram M. Castro, Fort Worth, TX (US)

(73) Assignee: Texas Instruments Incorporated, Dallas, TX (US)

( * ) Notice: Subject to any disclaimer, the term of this patent is extended or adjusted under 35 U.S.C. 154(b) by 277 days.

(21) Appl. No.: 13/013,438

(22) Filed: Jan. 25, 2011

(65) Prior Publication Data

US 2011/0143502 A1 Jun. 16, 2011

Related U.S. Application Data

(62) Division of application No. 12/361,768, filed on Jan. 29, 2009, now Pat. No. 7,898,083.

(60) Provisional application No. 61/138,210, filed on Dec. 17, 2008.

(51) Int. Cl.
*H01L 21/31* (2006.01)
*H01L 21/469* (2006.01)

(52) U.S. Cl.
USPC .... 438/780; 438/509; 438/687; 257/E21.006; 257/E21.007; 257/E21.077; 257/E21.259; 257/E21.261; 257/E21.499; 257/E21.508

(58) Field of Classification Search
USPC ................ 438/780, 767, 612, 613, 618, 687, 438/509; 257/E21.006, E21.007, E21.077, 257/E21.259, E21.267, E21.499, E21.508
See application file for complete search history.

(56) References Cited

U.S. PATENT DOCUMENTS

| 5,779,866 A * | 7/1998 | Tarancon ..................... 204/262 |
| 7,566,385 B2 * | 7/2009 | Mazur et al. ............ 204/224 M |
| 7,898,083 B2 * | 3/2011 | Castro ........................... 257/754 |

* cited by examiner

*Primary Examiner* — David Nhu
(74) *Attorney, Agent, or Firm* — Steven A. Shaw; W. James Brady; Frederick J. Telecky, Jr.

(57) ABSTRACT

A device including a first body (101) with terminals (102) on a surface (101a), each terminal having a metallic connector (110), which is shaped as a column substantially perpendicular to the surface. Preferably, the connectors have an aspect ratio of height to diameter of 2 to 1 or greater, and a fine pitch center-to-center. The connector end (110a) remote from the terminal is covered by a film (130) of a sintered paste including a metallic matrix embedded in a first polymeric compound. Further a second body (103) having metallic pads (140) facing the respective terminals (102). Each connector film (130) is in contact with the respective pad (140), whereby the first body (101) is spaced from the second body (103) with the connector columns (110) as standoff. A second polymeric compound (150) is filling the space of the standoff.

13 Claims, 6 Drawing Sheets

METHOD FOR LOW STRESS FLIP-CHIP ASSEMBLY OF FINE-PITCH SEMICONDUCTOR DEVICES

This is a division of application Ser. No. 12/168,280 filed Jul. 7, 2008, U.S. Pat. No. 7,898,083 which claims the benefit of provisional application Ser. No. 60/957,380 filed Aug. 22, 2007, the contents of which are herein incorporated by reference in its entirety.

FIELD OF THE INVENTION

The present invention is related in general to the field of semiconductor devices and processes and more specifically to the structure and fabrication method of fine pitch flip-chip interconnects for loss stress devices.

DESCRIPTION OF THE RELATED ART

The conventional flip-chip interconnection for attaching a semiconductor chip with a terminal pad to a substrate with a contact pad includes either a solder ball attached to the terminal pad and to the contact pad, or a gold (or copper) bump on the terminal pad connected to the solder on the contact pad, or to the gold-clad contact pad. Consequently, the sequence of terminal pad—interconnection—contact pad is an all-metal connection. The material for the chip may be silicon with a coefficient of thermal expansion (CTE) of about 2 ppm/° C., and for the substrate a ceramic or polymer compound with a CTE of about 15 to 22 ppm/° C. Various tin alloys with reflow temperatures between about 180 and 280° C. have been widely accepted as materials for the solder balls and the solder on the substrate pads. The smallest bump pitch center-to-center achievable with solder balls is about 160 µm, and with gold (or copper) bumps-and-solder about 40 µm.

As an example of the attachment process, in the flip-chip interconnection with the eutectic tin/lead alloy (reflow temperature 183° C.), chip and substrate are heated from ambient temperature to about 220° C. and back to ambient temperature in a cycle lasting about 20 min. Thermal equilibrium is established at the peak temperature. It is known that due to the wide CTE difference of chip and substrate, the cool-down cycle portion may introduce thermomechanical stress levels in the newly formed joints high enough to inflict microcracks in the structurally weakest parts of the assembly (such as joint constrictions or underlying low-k dielectric layers). The microcracks may eventually grow and cause an open and electrical failure of the joint.

In order to distribute and absorb at least a great portion of the stress, the gap between chip and substrate, spaced by the reflowed solder balls or the gold-and-solder connections, is customarily filled with a polymeric precursor. The process of underfilling starts right after the joint cool-down portion; the precursor is distributed at the assembly edge and pulled by capillary force into the space between chip and substrate. The process requires a temperature of about 70° C. to provide low viscosity of the precursor for underfilling within about 20 minutes. After again cooling the assembly to ambient temperature, the precursor material needs to be polymerized ("cured") in an oven at about 160° C. for about 2 hours. After the final cool-down to ambient temperature, the assembly is left with some residual non-zero stress.

There are commercial manufacturing equipments available, which perform the underfilling step without first cooling the devices to ambient temperature; instead, the interim temperature is kept at a controlled intermediate value throughout the underfilling step. Only after polymerizing the precursor at an elevated temperature, are the assembled devices finally cooled to ambient temperature. The equipments further allow the underfilling operation under vacuum conditions in order to strongly enhance the capillary pulling force into gaps of less than about 20 µm height. A manufacturing machine for high throughput, controlled temperatures and gases, and vacuum capability, however, is expensive (on the order of $1 million).

The preferred method for manufacturing the gold and copper bumps is a modified wire ball technique, wherein a wire portion is first molten to create a free air ball, and then pressured against the terminal pad to adhere as a deformed sphere. The wire is broken off at the mechanically weak heat-affected zone, and the remaining wire "tail" is commonly flattened by coining. The gold (or copper) bumps are then attached to the substrate with the help of solder paste on the substrate contact pads. Experience has shown that the low aspect ratio of the solder connections (short height, large and mostly non-uniform width) renders the connections unfavorable for stress distribution and strain absorption and makes them vulnerable to early material fatigue and crack phenomena. In addition, the low height of the gap between chip and substrate renders the step of underfilling a challenging process.

In specialty products, the solder is replaced by a conductive adhesive. In one group of adhesives, the electrical current flows in metal-filled nano-vias oriented in the z-axis. In another group of adhesives, the electrical conductivity is provided by metal particles (such as silver) suspended in a polymer compound (such as an epoxy). Conductive adhesives offer only limited electrical and thermal properties and need extended processing times in excess of one hour.

The need to accommodate high numbers of high input/output terminals on small-area chips drives the industry trend towards ever smaller pitch center—to-center of the terminals and thus towards smaller bumps. On the substrate surfaces, the small bumps require thin insulating layers (so-called solder resist or solder mask, less than about 12 µm thickness) between the bumps. On the other hand, insulator dams on the substrate surface to stop the underfill polymers require a thickness of about 20 to 25 µm. Finally, the insulating separators between the large solder balls for package assembly require solder resists of more than 40 µm thickness. Consequently, the fabrication of the multi-thickness insulating layers on substrate surfaces is cost-intensive.

SUMMARY OF THE INVENTION

Applicant recognized that the market trends towards higher input/output, yet thinner semiconductor devices demand the flip-assembly of ever larger chips having a pitch of the terminals, center-to-center, finer than present technology can provide. Applicant further saw that the high reliability required in many applications, such as medical applications, cannot tolerate the risk of functional failure by microcracks in the assembly connections due to thermomechanical stress. In addition, the present time-consuming fabrication flow, requiring expensive equipment for temperature and vacuum control, is incompatible with the market trend of rapidly changing customer requirements demanding short manufacturing turn-around time and low fabrication cost.

Applicant discovered that the use of high-aspect ratio connections, such as metallic columns (having for example a height of 40 µm versus a diameter of 20 µm), offers several benefits compared to the presently used low-aspect ratio connections, such as metal bumps. High-aspect ratio connections provide greater robustness for thermomechanical stress and create a wider gap between chip and substrate, thus enabling shorter process times for filling the gap with a precursor material, since the filling time is inversely proportional to the width. A wider gap further reduces the risk of incomplete filling and local voids in the underfill precursor.

In addition, high-aspect ratio connections avoid the need for various insulator (solder resist) thicknesses on the substrate surface, and for manufacturing equipment with vacuum-enhanced underlining—advantages resulting in significant cost savings.

Applicant solved the problem of microcracks in the connections between the chips and substrate by replacing presently used low aspect-ratio connections (bumps) with high aspect-ratio connections (columns), coupled with replacing the presently used reflow solder for all-metal connections with a sinterable paste for composite connections. The paste includes copper and tin/bismuth particles, which sinter into a metallic matrix embedded in the thermoset polymeric compound; after sintering, the paste is robust and resilient against thermomechancial stress.

Selecting the paste for composite connections further replaces the present process flow of time-consuming consecutive high temperature (higher than 200° C.) cycles for the steps of reflowing the solder and curing the underfill polymer, separated by a cool-down to ambient temperature, by a process flow of a single cycle. Bonding the paste to the substrate and partially sintering the metallic matrix requires an only modestly elevated temperature (about 100° C.); at the same temperature, the step of underfilling is performed. Without cool-down, the matrix is finalized together with the curing of the underfill compound at the increased temperature of about 200° C., before the assembly is cooled to ambient temperature. The integrated manufacturing cycle minimizes thermomechanical stresses. In addition, the need for special manufacturing equipment for controlling temperature cycles is avoided.

The high aspect ratio interconnects are preferably made of low-cost copper columns attached to the chip. These columns allow a pitch center-to-center of 30 μm or less. The sinterable paste is applied to the columns by dipping the array of columns into the paste, which adheres as a film surrounding each column. The sintering step does not interfere with the pitch of the columns; consequently, the column pitch (such as 30 μm) is maintained as the pitch center-to-center of the connections of the assembled device.

Before polymerization and metal network formation, the sinterable paste includes a low-viscosity polymer base (such as epoxy) compound loaded with 80 to 90% metallic fillers of copper particles and alloy particles (such as bismuth and tin). The particles have a size distribution with a maximum preferably between about 3 and 10 μm. After the steps of solvent removal and of alloy sintering, the sintered paste includes a metal matrix of copper/tin intermetallics immersed in the compound. The formative steps need only 15 to 60 min. The metal matrix exhibits excellent electrical and thermal conductivities.

BRIEF DESCRIPTION OF THE DRAWINGS

FIG. 3 is a schematic cross section of a semiconductor wafer with a photoresist layer having openings to the terminals, the openings at least partially filled with column-like metal connectors.

FIG. 4 shows a schematic cross section of a singulated semiconductor chip with column-like metal connectors.

FIG. 5 illustrates the process step of partially dipping the connectors into a paste with particles of metal and metal oxide dispersed in a liquid first polymeric compound.

FIG. 6 depicts the process step of bringing the film-coated connectors of the chip in contact with the metallic pads of a substrate to tack-attach the chip to the substrate.

FIG. 7 shows a schematic cross section of the assembled semiconductor chip after the step of filling the gap between the chip and the substrate with a second polymeric compound.

FIG. 8 shows the time-temperature diagram according to the invention.

FIG. 9 depicts the time-temperature diagram according to a conventional process flow.

DETAILED DESCRIPTION OF THE PREFERRED EMBODIMENTS

Figure 1:
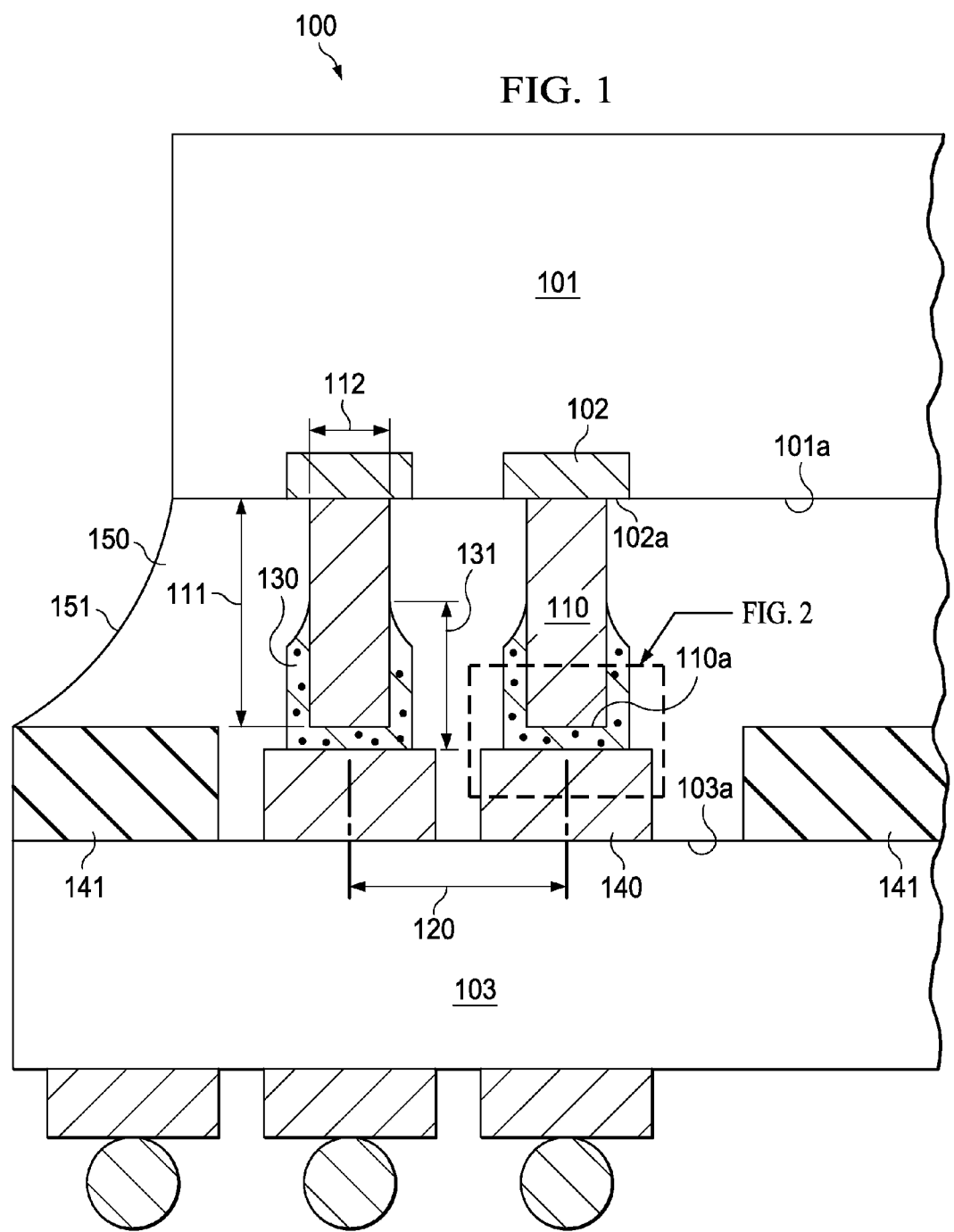
FIG. 1 shows a schematic cross section of an embodiment of the invention, a semiconductor chip flip-assembled on a substrate using high aspect-ratio connectors and a sinterable paste including a metallic matrix embedded in a polymeric thermoset compound.

FIG. 1 illustrates an exemplary embodiment, generally designated 100, of the invention. A first body 101 with terminals 102 on the body surface 101a is assembled onto a second body 103. In a preferred embodiment of the invention, first body 101 is a semiconductor chip, terminals 102 are metal lands suitable for the attachment of connectors, which are preferably metallic, and second body 103 is an insulating substrate. As an example, terminals 102 may be lands made of copper with a metallurgical configuration of its surface 102a including a nickel layer in contact with the copper, followed by an outermost layer of gold.

As the example of FIG. 1 shows, attached on each terminal 102 is one end of a metallic connector 110, which is shaped as a column or pillar and oriented substantially perpendicular to the surface 101a. The columnar connector 110 may have cylindrical shape or slightly conical; it has a height 111 and an average diameter 112. Preferably the aspect ratio of height 111 to diameter 112 is 2 to 1 or greater. For example, for a semiconductor chip 101, height 111 may be 40 μm or more, and diameter 112 may be 20 μm or less. In this example, the pitch 120 center-to-center of connectors aligned in a row may be 60 μm or less; for additional parallel rows with staggered connector positions relative to the first row (not shown in FIG. 1), the pitch center-to-center of staggered connectors may be only 30 μm or less.

When connector 110 is metallic, the preferred metal is copper or a copper alloy. Alternatively, connector 110 may be made of gold or solder. The preferred method of depositing and attaching connector 110 to terminal 102 is a plating process using openings in a temporary photoresist layer on surface 101a. Terminals 102 have a metallurgical surface configuration (for instance a thin gold layer), which allows a reliable attachment of the copper (or gold or solder) being plated onto terminal 102.

As FIG. 1 illustrates, the connector end remote from terminal 102, designated 110a in FIG. 1, is covered by a film 130. The film includes a matrix of sintered metal with inclusions of a first polymeric compound. Film 130 extends from the connector end 110a along the connector surface to cover a portion 131 of the connector height like a sleeve. Portion 131 is preferably not more than about half of the connector height 111. Preferably, film 130 has a thickness approximately equal throughout the extension of the film; alternatively, the film may have a somewhat greater thickness at the connector end 110a.

The metallic matrix includes particles of copper, tin, bismuth, and compounds and alloys thereof, which contact each other to form an electrically and thermally conductive network. The first polymeric compound includes an epoxy-based thermoset compound, which polymerizes from an original state of low viscosity to a non-remelting hardened state. A variety of particle-filled pastes for sintering are commercially available, for instance from the company Ormet Circuits, U.S.A.

For the assembly of a semiconductor chip 101, the low viscosity epoxy-based polymer of paste 130 has preferably a particle loading between about 80 and 90%. The particle powder is a mixture of copper particles with a size distribution maximum at about 3 µm diameter and tin/bismuth alloy particles with a size distribution maximum at about 10 µm diameter. After sintering, an interconnected network of touching particles of various copper/tin intermetallics (such as $Cu_3Sn$ and $Cu_6Sn_5$) is formed. As discussed below, the sintering process is accomplished by a solvent removal step at about 90° C. and an alloy sintering step at about 150° C.

The preferred pastes produce a film thickness in the range between about 5 and 10 µm at the tip of connector 110 and along the sides of connector 110. Other pastes produce a thicker film at the connector tip, for example between about 10 and 20 µm. In the attachment and polymerization steps, film 130 does not substantially change its distribution and thickness on connector 110; in particular, it does not noticeably bulge out in the attachment process. As a consequence, the connector pitch center-to-center remains substantially constant, while in contrast, conventional connector attachment using solder is notorious for the risk of bridging between adjacent liquified solder bodies due to solder bulging sidewise.

Figure 2:
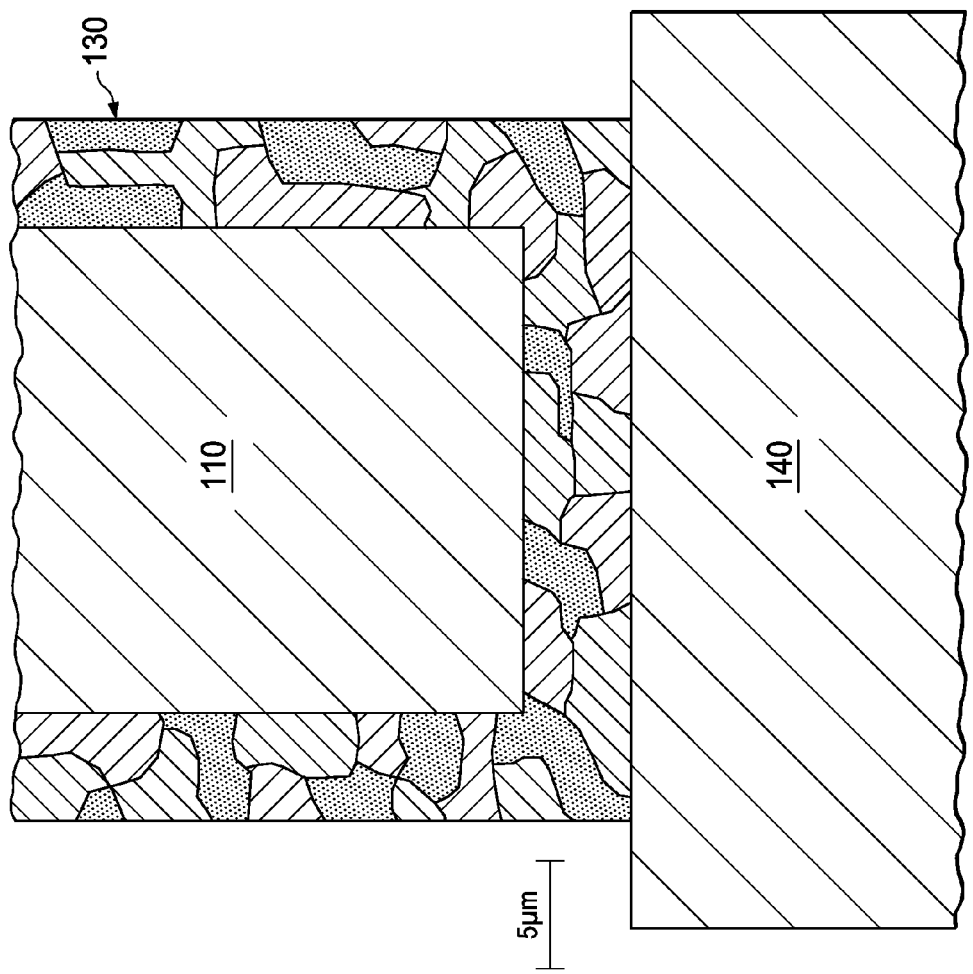
FIG. 2 is an enlarged cross section of the contact portion highlighted in FIG. 1, the cross section showing detail of the metallic matrix embedded in the first polymeric compound.

As an illustrative example, FIG. 2 depicts an enlarged cross section of the tip of connector 110 attached by sintered paste 130 to metallic pad 140. The scale (see the 5 µm marker) gives an approximate representation of the metallic matrix (gray: copper and tin, whitish: bismuth) in the polymeric binder (black). Sintered paste 130 has about the same electrical and thermal conductivity as solder, and about the same coefficient of thermal expansion as solder and the second body 103. In addition, paste 130 is, in its sintered configuration, robust and resilient against thermomechanical stress. Consequently, the contact region of paste 130 to metal pad 140 is resistant against the formation of microcracks due to stress.

Referring now to FIG. 1, second body 103 is, in a preferred example for semiconductor devices, an insulating substrate with integrated conductive lines and vias. Second body 103 further has on its surface 103a metallic pads 140 in locations matching the locations of terminals 102; pads 140 face the respective terminals 102. Preferably, pads 140 are made of copper, which allows, as experience has shown, the attachment of the paste for film 130 at low compressive force at temperatures as low as 105° C. If surface 103a of second body 103 has an optional protective insulating layer (so-called solder mask or solder resist) 141 for defining pads 140, the layer needs only one thickness for the whole surface and is thus inexpensive. No specific flip-chip surface finish is required.

The connector films 130 of the connectors 102 in FIG. 1 have been processed through the attachment step to the respective pads 140 and the sintering step (see below), establishing the electrical contact between first body 101 and second body 103. Structurally, first body 101 is spaced from second body 103, with the height 111 of the columnar connectors 110 defining the standoff. A second polymeric compound 150, commonly referred to as the underfilling compound, fills the standoff space. Compound 150 serves to absorb and buffer thermomechanical stress and thus contributes to protect the assembled connectors and the underlying mechanically weak material layers against microcracks. As FIG. 1 indicates, the space between first and second bodies is filled free of voids. Compound 150 is epoxy-based and has completed polymerization (see below); it and adheres to first body 101 and second body 103 as well as to the connectors 110.

Figure 3:
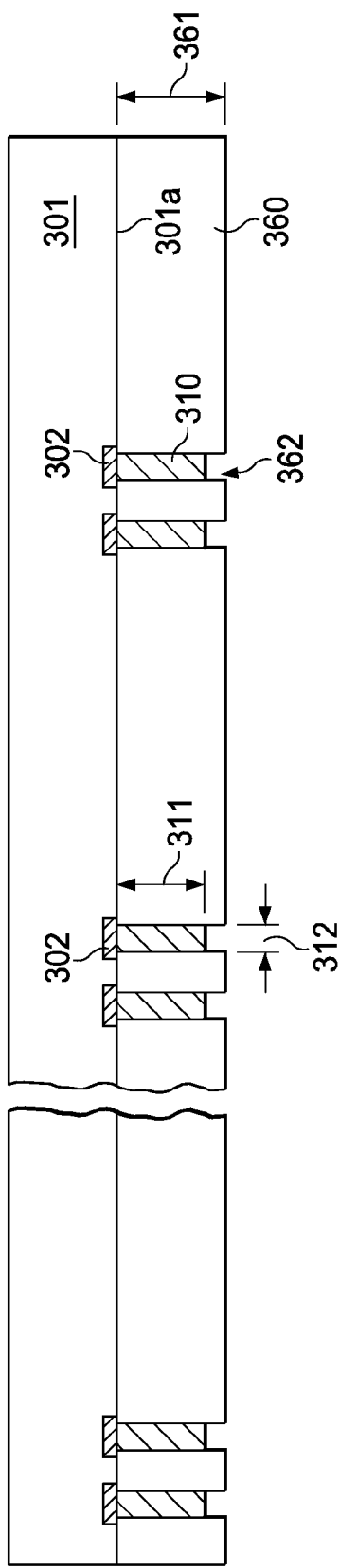
FIGS. 3 to 7 depict selected process steps of the connector preparation and the flip-chip process according to the invention.

FIGS. 3 to 7 illustrate selected steps of preparing the connectors on the first body in a batch process and of flip-assembling a singulated first body onto a second body. FIG. 3 shows an undivided first body 301 with a plurality of terminals 302 on the surface 301a of the first body. In the preferred embodiment, the undivided first body 301 is a semiconductor wafer and the terminals 302 are copper terminals in locations suitable for the future singulated chips. On the surface 301a is a layer 360 of photoresist covering the whole surface of the undivided first body. Layer 360 has a thickness 361 and openings 362 extending through the thickness to the terminals 302. The openings may have a circular cross section or a cross section of any other configuration, and are preferably oriented substantially perpendicular to the surface 301a. As an example for semiconductor wafers, the photoresist layer 360 covers the whole wafer surface; the thickness 361 of the photoresist may be 50 µm, and the diameter 312 of circular openings may be 20 µm. The reason for selecting a large photoresist thickness yet small opening diameters is discussed below.

The preferred method of filling the openings is a plating process. A metal 310 is deposited in the openings until the openings are almost filled. The selected metal has a metallurgical affinity to the metal of terminals 302. For semiconductor wafers, metal 310 is preferably copper or a copper alloy; alternatively, gold or solder may be used. As an example, for a photoresist thickness of 50 µm, the height 311 of the deposited metal 310 may be about 40 µm. Of course, greater heights can be produced using larger photoresist thicknesses.

Figure 4:
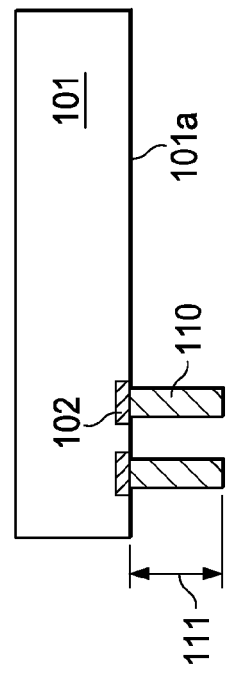

In the next process steps, the photoresist 360 is removed and the undivided first body 301 is prepared for singulation into discrete units. In the case of a semiconductor wafer, these process steps include backgrinding and sawing. An exemplary singulated first body 101 with attached metal connectors 110 is shown in FIG. 4 (the designations of the singulated body become the same as the respective designations in FIG. 1). The connectors 110 are shaped as columns or pillars, with one end of each connector attached to the respective terminal 102, and are preferably oriented substantially perpendicular to the body surface 101a.

Figure 5:
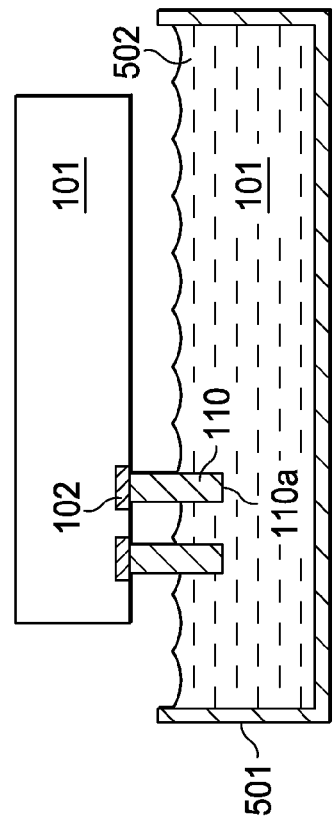

In the next process step, illustrated in FIG. 5, a container 501 is filled with a paste 502. The paste has a low-viscosity (liquid) binder, which includes a thermoset epoxy-based polymer formulation and a solvent such as butyl carbitol. Dispersed in the liquid are particles of metals such as copper and alloys such as tin/bismuth alloys with a particle loading between about 80 and 90%. The particles are in powder form and have a distribution of sizes; as an example, for copper, the distribution maximum is at about 3 μm diameter, and for tin/bismuth alloy, the distribution maximum is at about 10 μm diameter.

The ends 110a of connectors 110, which are not attached to terminals 102, are dipped into paste 502 so that preferably not more than 50% of connector height 111 is immersed in the paste. Next, when the connectors are pulled out of the paste, a film of the paste keeps adhering to each dipped connector portion as a coat of approximately uniform thickness. For application in some semiconductor devices, the film has preferably a thickness between about 5 and 10 μm; in other semiconductor devices, the film may have a thickness of about 10 to 20 μm. For some applications, it is advantageous to have film with a somewhat larger thickness at the connector tip 110a than in the sleeve portions.

Figure 6:
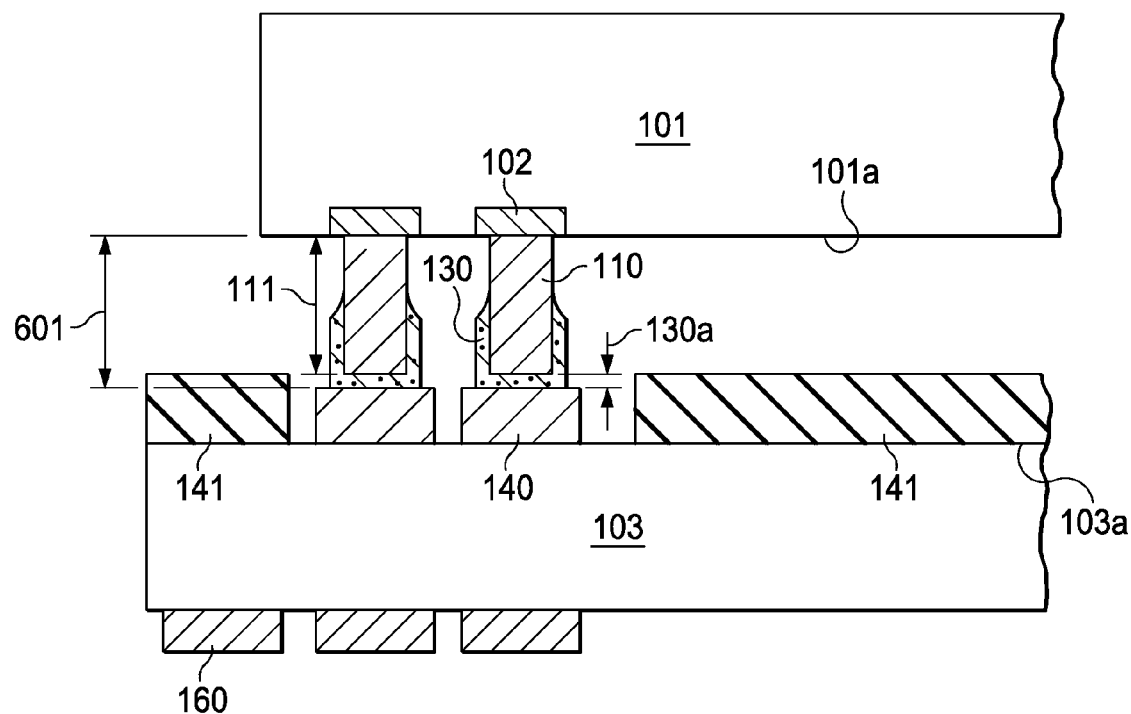

FIG. 6 summarizes the next process steps. A second body 103 is selected with contact pads 140 on surface 103a in locations matching the terminals 102 of the first body; the contact pads are preferably metallic. Second body 103 may be an insulating substrate integral with conductive traces and through-vias; it may further include pads 160 for solder balls to interconnect to external parts. Second body 103 is then oriented so that surface 103a faces surface 101a of first body 101, and pads 140 are aligned with terminals 102.

Next, second body 103 is heated to a first elevated temperature, which is preferably between 105 to 115° C. Alternatively, it may be lower (between about 85 and 95° C.). After the first elevated temperature is reached, the connectors 110, coated with film 130, are brought in contact with the metallic pads 140 of second body 103. After about 2 to 5 minutes at the first elevated temperature, adhesive bonds (sometimes referred to as tack bonds) are established; the solvent of the paste is partially removed and the melting and sintering of the alloy particles has started. This sintering process continues during the next process step (see below). It has been demonstrated for semiconductor chips with copper connectors that the sinterable copper of the paste can be tack-attached with low pressure force to the bare copper of the substrate contact pads at temperatures as low as 105° C.

As a result of the assembly, first body 101 is spaced apart from second body 103, with the standoff 601 determined by the height 111 of the connectors plus the thickness 130a of the paste film. In addition, the process of tack-attaching allows the fine pitch between the connectors to be maintained, since the paste has only very limited flow and no bridging between adjacent connectors is observed. It is another advantage of the tack-attachment that no special surface finish of the substrate pads is required.

Figure 7:
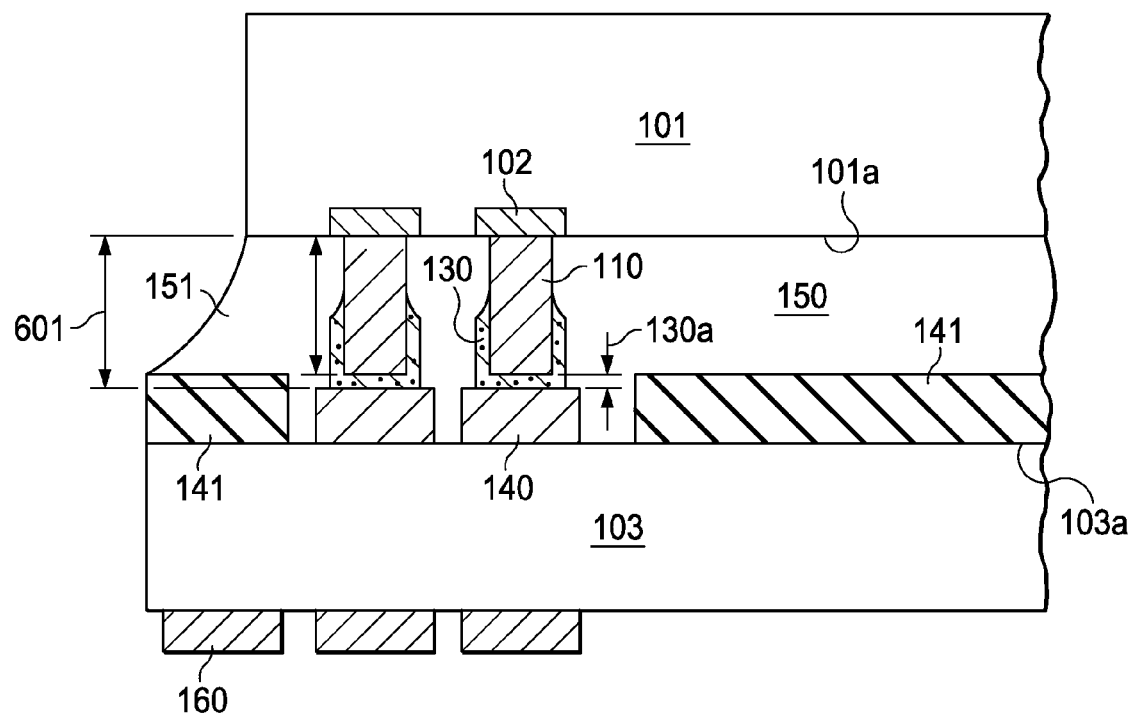

FIG. 7 shows the continuation of the process flow at the same first elevated temperature. The space of the standoff is filled with a precursor 150 of a second polymer compound. In the preferred process, the second polymeric compound is different from the first polymeric compound. For some applications, the compound may have the same epoxy base. The filling is accomplished by capillary pulling force. No vacuum suction in support of the capillary pulling force is required for this underfill step due to the wide standoff 601. Further, the underfilling step takes less than 5 minutes, since the filling time is inversely proportional to the height of the standoff 601. The underfilling step can be performed without leaving voids in the standoff.

Both advantages, the filling without the help from vacuum suction and the filling in a short time span, are enabled by selecting sufficient height for the standoff through sufficient height of the connectors. In the time span of the underfilling process at the first elevated temperature, the metallic sintering process throughout the paste continues.

In the preferred process flow, the transfer of the assembled devices into the underfill cure oven (so-called staging) is performed by an automated transport, keeping the first elevated temperature constant. In this manner, no thermomechanical stress is created. Alternatively, the devices may be brought back to ambient temperature to be shuttled to a separate underfilling station. This step should take less than 30 minutes. The thermomechanical stress on the joint, exerted by this approach, is only minor, since the preceding tack attach and underfilling were performed at the relatively low first temperature.

The curing of the second polymeric compound (polymerization by crosslinking) and the continuation of the metal sintering in the paste are performed simultaneously at a second elevated temperature higher than the first elevated temperature. Preferably the second elevated temperature is between about 140 and 160° C., and the time period at this temperature includes approximately 2 hours. The metal sintering process specifically aims at forming a copper matrix with inclusions of the first polymeric compound. While this process progresses at the second elevated temperature, it will only be fully completed at a still higher third elevated temperature.

The matrix may be fully sintered at a third elevated temperature between about 210 and 220° C., higher than the second elevated temperature. Preferably, though, the final matrix formation is performed simultaneously with the attachment of solder balls 701 to the pads 160 (see FIG. 7). For this purpose, the assembled devices have to be moved from the underfill cure oven to the solderball attachment oven; the staging involves a brief exposure to ambient temperature (staging). The solder attachment is completed in 12 to 15 minutes.

Figure 8:
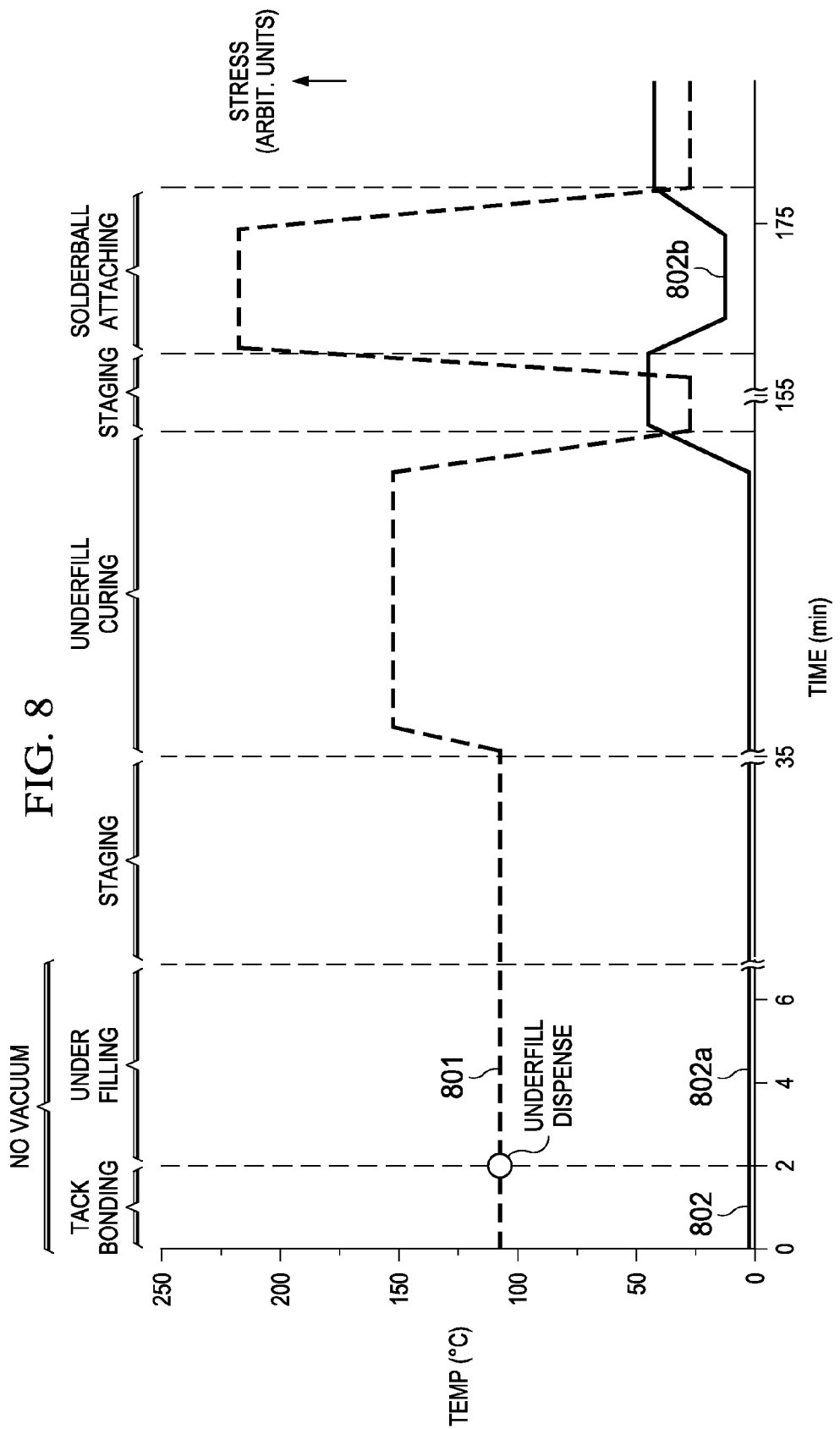
FIGS. 8 and 9 are time-temperature diagrams illustrating the process flow for assembling a semiconductor ball grid array device through the steps of flip-chip attaching, underfilling, curing and solder ball attaching, comparing the process flow of the invention with a conventional process flow.

The fabrication method outlined above is summarized by the graph sections 801 in the time-temperature diagram of FIG. 8. Time is plotted in minutes and temperature in ° C. The time-temperature diagram is supplemented by the graph sections 802 of the thermomechanical stress. The stress values are plotted in arbitrary units and have been obtained by stress modeling.

As FIG. 8 shows, the high-aspect ratio and composite structure of the connectors and the solder-free method of the invention result in only minimal thermomechanical stress on the connection joints (graph sections 802a). When the attachment of the solder balls for external connection requires a cooling to ambient temperature and then an exposure to the third elevated temperature of reflowing the solder, the underfill polymer is already in place to absorb the majority of the stress, and the metal-and-paste composition of the connectors is robust and resilient against stress. Consequently, the stress levels reach only low levels (graph sections 802b), which represent no risk for the connection joints. It is further listed in FIG. 8 that no vacuum is needed to support the capillary force in the underfilling process.

Figure 9:
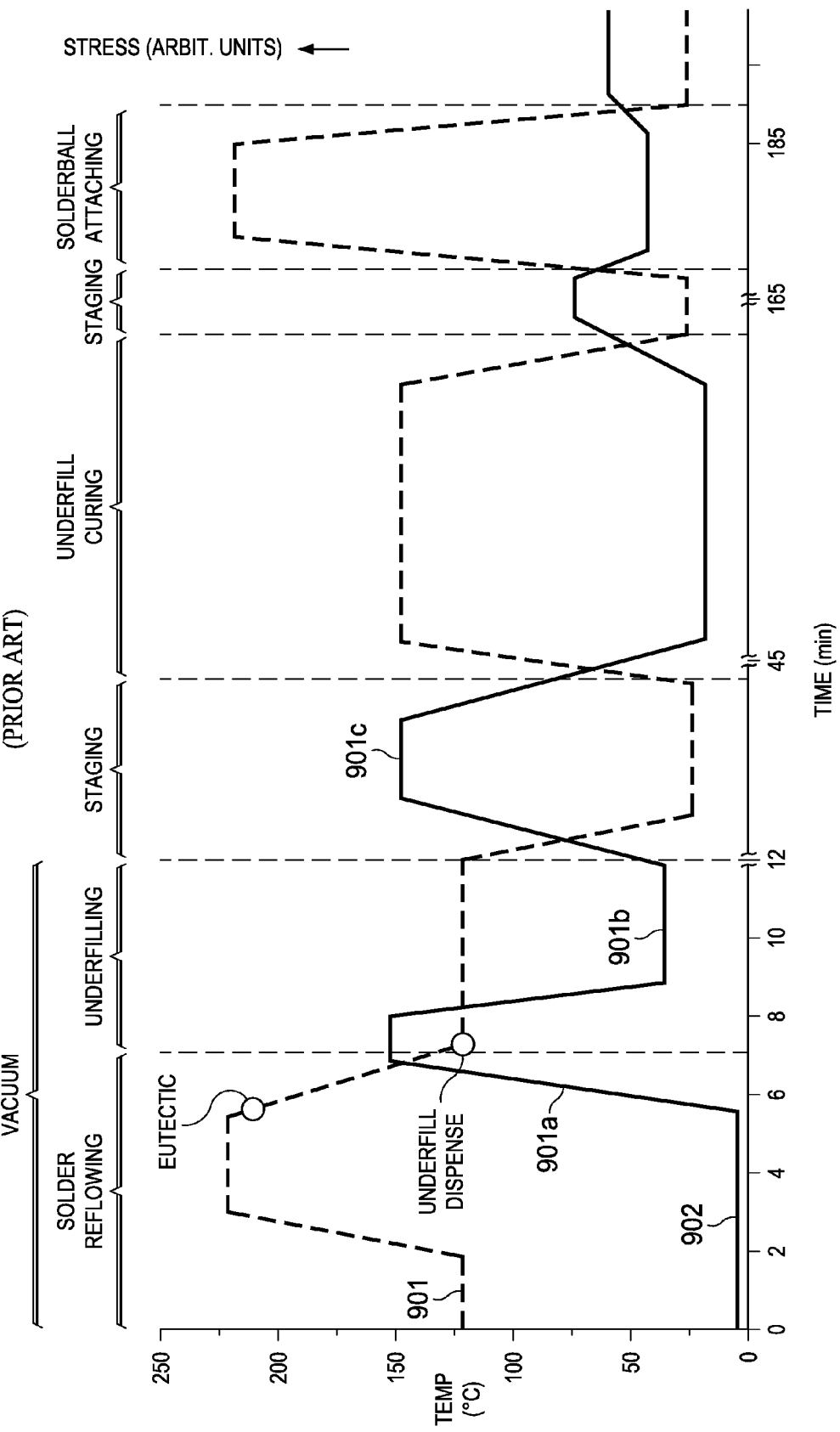

In contrast to the low stress levels induced by the structure and process flow of the invention, the time-temperature diagram of FIG. 9 illustrates the consequences of the conventional assembly of low-aspect ratio and all-metal connectors involving solder reflow. As the temperature versus time graph sections 901 show, the reflow of the solder material (eutectic) requires a temperature of 220° C. or more (contrast this temperature to the 105 to 115° C. for the tack bonding of the invention!). During the thermal equilibrium at the melting temperature, the corresponding stress graph sections indicate minimal stress levels. With continued cooling of the assembly, though, stress starts appearing (901*a*) and increases rapidly. At these stress levels, microcracks may be inflicted to structurally weak regions. The stress settles to a lower level (901*b*) at the intermediate temperature of the step of underfilling the polymeric precursor. Since the conventional connectors are squashed ball bond or metal bumps, the standard dispensing procedure using a syringe with a nozzle requires the support of vacuum to draw the precursor into the narrow standoff between the first and the second body without voids and in an acceptable time span.

In the time span of moving the assembly at ambient temperature to the next work station (staging), the stress increases again to values (901*c*) as high as in the previous cooling cycle. Since the underfill polymer is not cured yet, damage by microcracks may again happen to joints and structurally weak regions.

Referring now to FIGS. 6 and 7, the structure and the process flow of the invention implies that the second body does not require any special solder resist (141 in FIGS. 1, 6 and 7) for successful flow of the underfill precursor, a significant cost saving in the semiconductor industry compared to the various resist thicknesses required by standard processing. In addition, no special surface finish, such as copper preparation, is required on the substrate pads. It is further implied that none of the special equipment is required which is, for example, needed for attaching chip bumps of gold to gold-plated substrate pads in semiconductor technology. In addition, no flux and no clean-ups are required. As stated earlier, the avoidance of special heating and vacuum capabilities in the assembly equipment amounts to huge cost savings.

Using the sinterable paste replaces the conventional solder on the second body (substrate) pads. The risk of squashing the liquid solder beyond and between the pads is thus avoided. The fine pitch center-to-center (30 μm) of connectors in adjacent rows can be maintained and scaled for next generations of devices.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any type of semiconductor chip, discrete or integrated circuit, and the material of the semiconductor chip may include silicon, silicon germanium, gallium arsenide, or any other semiconductor or compound material used in integrated circuit manufacturing.

As another example, the invention can be applied to wafer chip-scale packages and to package-on-package assemblies, especially for structures involving through-silicon vias (TSV), for both chip-to-chip and chip-to-substrate configurations. Uniquely, the great height of the connectors described above enables not only flip-chip/flip-chip applications, but also flip-chip/wire bond applications.

As another example, the method can be extended beyond the fabrication of semiconductor devices to an assembly of any two flat bodies, where one body has the tall connectors to be immersed in the sinterable paste and the other body has the contact pads for the paste. One or both of the bodies may also include devices such as Micro-Electro-Mechanical devices (MEMS), medical and photographic devices, and automotive controls.

It is therefore intended that the appended claims encompass any such modifications or embodiments.

I claim:

1. A method for fabricating a device comprising:
  connecting a first end of a columnar connector to a surface of a first body;
  dipping a second end of the columnar connector into a paste comprising metallic particles dispersed in a first polymeric compound, thereby coating the second end of the columnar connector with a film of the first polymeric compound;
  attaching the film-coated second end of the columnar connector to a second body, forming an assembly with a gap between the first body and the second body;
  heating the assembly at a first elevated temperature to form a bond between the columnar connector and the second body;
  filling the gap with a second polymeric compound different from the first polymeric compound; and
  polymerizing the second polymeric compound and sintering the metallic particles into a metallic matrix with inclusions of the first polymeric compound at a second temperature.

2. The method of fabricating a device according to claim 1 further including heating the assembly to a third temperature higher than the second temperature for additional sintering of the metallic matrix.

3. The method of fabricating a device according to claim 2 wherein the third temperature also reflows solder balls attached to the second body for external connection.

4. The method of fabricating a device according to claim 1 wherein the film coated onto the columnar connector has a substantially uniform thickness with a meniscus at an edge of the coated film.

5. The method of fabricating a device according to claim 1 wherein the first elevated temperature is between about 105 and 115° C.

6. The method of fabricating a device according to claim 1 wherein the second elevated temperature is between 140 and 160° C.

7. The method of fabricating a device according to claim 1 wherein the third elevated temperature is between 210 and 220° C.

8. The method of fabricating a device according to claim 1 wherein the first body is a semiconductor wafer.

9. The method of fabricating a device according to claim 1 wherein the first body is a semiconductor chip.

10. The method of fabricating a device according to claim 1, wherein the metallic particles include copper.

11. The method of fabricating a device according to claim 10, wherein the metallic particles further include tin and bismuth and their alloy.

12. The method of fabricating a device according to claim 1, wherein the first polymeric compound comprises thermoset polymeric compound.

13. The method of fabricating a device according to claim 1, wherein the metallic matrix includes copper/tin intermetallic compounds.

* * * * *